United States Patent
Fujishima

[11] Patent Number: 6,148,505
[45] Date of Patent: *Nov. 21, 2000

[54] SYSTEM AND METHOD FOR WIRING ELECTRONIC COMPONENTS IN A THREE-DIMENSIONAL MANNER

[75] Inventor: Mitsushiro Fujishima, Nagoya, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/055,767

[22] Filed: Apr. 7, 1998

[30] Foreign Application Priority Data

Jul. 16, 1997 [JP] Japan .................................. 9-191654

[51] Int. Cl.$^7$ .................................................. B23P 19/00
[52] U.S. Cl. .............................. 29/740; 29/741; 29/742; 29/747; 29/748; 29/840; 228/4.5; 228/102; 228/110.1; 228/173.1
[58] Field of Search ............................ 29/740, 741, 840, 29/745, 843, 746, 830, 747, 742, 748, 743, 749; 228/4.5, 179.1, 110.1, 102

[56] References Cited

U.S. PATENT DOCUMENTS

| | | | |
|---|---|---|---|
| 4,437,604 | 3/1984 | Razon et al. ............................. | 228/179 |
| 4,597,519 | 7/1986 | Kurtz et al. .............................. | 228/102 |
| 4,876,791 | 10/1989 | Michaud et al. ....................... | 29/840 X |
| 4,877,173 | 10/1989 | Fujimoto et al. ........................ | 228/1.1 |
| 4,976,393 | 12/1990 | Nakajima et al. ...................... | 228/111 |
| 4,979,290 | 12/1990 | Chiba ..................................... | 29/840 X |
| 5,037,023 | 8/1991 | Akiyama et al. ........................ | 228/102 |
| 5,054,194 | 10/1991 | Pollock .................................... | 29/840 |
| 5,176,310 | 1/1993 | Akiyama et al. ........................ | 228/179 |
| 5,220,724 | 6/1993 | Gerstner .................................. | 29/840 |
| 5,340,771 | 8/1994 | Rostoker ................................. | 437/209 |
| 5,720,099 | 2/1998 | Parker et al. ............................ | 29/825 |
| 5,834,162 | 11/1998 | Malba ..................................... | 430/317 |
| 5,852,869 | 12/1998 | Gieskes et al. .......................... | 29/834 |
| 5,867,897 | 2/1999 | Mimura et al. ......................... | 29/840 |
| 5,868,300 | 2/1999 | Babayan .............................. | 228/180.5 X |
| 5,898,226 | 4/1999 | Jeong et al. ............................. | 257/786 |

FOREIGN PATENT DOCUMENTS

| | | |
|---|---|---|
| 1-231400 | 9/1989 | Japan . |
| 6-314720 | 11/1994 | Japan . |
| 8-222595 | 8/1996 | Japan . |

Primary Examiner—Valencia Martin-Wallace
Assistant Examiner—Binh-An Nguyen
Attorney, Agent, or Firm—Sughrue, Mion, Zinn, Macpeak & Seas, PLLC

[57] ABSTRACT

A system and method for wiring electronic components in a three-dimensional manner. The wiring system includes a means for temporarily placing components on a substrate, a means for directly or indirectly connecting electrodes of the components together with wires, a means for removing the temporarily-placed components from the substrate, and a means for rearranging the components in a three-dimensional manner. The movable section permits the means for bonding to bond the wires to the components from any direction in the three-dimensional space. The means for directly or indirectly connecting the electrodes of the components together with wires includes a means for placing a wiring-branch pad in a space between the electrodes of the components to be indirectly connected together, and a means for bonding the electrodes of the components to the wiring-branch pad. The means for bonding the electrodes of the components to the wiring-branch pad includes a bonding head having a capillary, and a movable section for axially orienting the capillary of the bonding head in a three-dimensional space. The wiring-branch pad includes unit pads, each for electrically bonding a wire thereto, and virtual lines separating the unit pads from one another. The virtual lines prevent, via surface tension, melted metal from flowing onto adjacent ones of the unit pads from a particular one of the unit pads when bonding a wire to the particular one of the unit pads.

6 Claims, 19 Drawing Sheets

SYSTEM AND METHOD FOR WIRING ELECTRONIC COMPONENTS IN A THREE-DIMENSIONAL MANNER

BACKGROUND OF THE INVENTION

1. Field of the Invention

The present invention relates to a system and method for wiring electronic components in a three-dimensional manner, and more particularly, to a wiring system which includes a bonding apparatus and a wiring-branch pad, and can easily and flexibly wire between three-dimensionally arranged components of a printed board such that the size of the printed board may be reduced. This application is based on Japanese patent application No.ÊHEI 9-191654, which is incorporated herein by reference.

2. Description of the Related Art

Conventional methods of manufacturing a wiring layer between adjacent layers of electronic components of a printed board including a substrate (i.e., a bare board) made of resin or ceramic generally requires several weeks to several months. Further, components in these conventional printed boards can be arranged only in a plane.

Compact-sized electronic equipment, such as portable equipment, require electronic components to be three-dimensionally packaged on a surface of a frame or the like. To satisfy this need, wire-bonding apparatuses have been used to wire between electronic components. For example, an apparatus for preventing distortion or breakage of a wire due to intersection of wires during wire-bonding is disclosed in Japanese Patent Laid-Open Publication No. HEI 8-222595. Additionally, a bonding apparatus for wiring between pads 201 on a substrate K with a lead wire 205 covered with an insulating material, as illustrated in FIG. 19, is disclosed in Japanese Patent Laid-Open Publication No. HEI 6-314720.

These conventional wire-bonding apparatuses are used solely for linearly wiring a short distance, mainly from a bare chip (e.g., silicon chip) to a lead section of a component or to a printed board. That is, the wiring is used in a planar arrangement of components rather than components which are three-dimensionally packaged. An effective means for three-dimensionally packaging components has not been previously developed.

Further, the technologies disclosed in Japanese Patent Laid-Open Publication No. HEI 8-222595 and in Japanese Patent Laid-Open Publication No. HEI 6-314720 respectively relate to wiring only between two electrodes, and therefore are not fully applicable to compact-sized electronic equipment which require a substrate having a pad to be wired.

SUMMARY OF THE INVENTION

It is an object of the present invention to provide a wiring method for easily and flexibly arranging components in a three-dimensional manner.

It is a further object of the present invention to provide a wiring-branch pad used for the aforementioned wiring method.

It is a further object of the present invention to provide a bonding apparatus for performing the aforementioned wiring method.

It is still a further object of the present invention to provide a computer-readable recording medium having a program, for use by a computer, for executing the aforementioned wiring method.

According to the present invention, components are three-dimensionally packaged more easily and compactly by temporarily arranging the components in a plane, connecting wires between electrodes of the components, and then rearranging the components in a three-dimensional manner. By wiring the components together while the components are located on a surface of the substrate and then rearranging the components in a three-dimensional manner allows the wiring to be more easily manufactured. Components can be directly or indirectly wired so that a prototype substrate can be prepared within a short period of time, reflection noise generated by a board of the substrate or the like is reduced, and the wiring method can be applied to manufacture a high-frequency circuit. The present invention is most useful in portable equipment or the like having a smaller plane space for component arrangement.

According to another aspect of the present invention, wire branching is performed using a wiring-branch pad so that the wire can be securely and easily branched and wired. This is a significant improvement over conventional boards in which a lead and a pad of a component do not always have an enough area onto which a plurality of wires can be connected thereby making wire-branching impossible.

According to another aspect of the present invention, wiring is more efficiently and easily executed by starting between any electrodes where the wiring does not cross over another electrode. Also, wiring may be executed by bypassing the electrode to be wired using the wiring-branch pad as described above.

According to still another aspect of the present invention, wiring is more securely and efficiently carried out by starting from the lowest wiring position. Since wire is generally wired in a form of an arc, executing wiring first at a low position avoids the arc becoming an obstacle when wiring is carried out at a higher position.

According to another aspect of the present invention, wiring is more securely and efficiently carried out by starting from a section with the shortest wiring length. Starting wiring from a section with the shortest wiring length prevents the long wires from becoming an obstacle during subsequent wiring.

Further, wire-branching and wiring may be more securely and easily performed by using wiring-branch pads. The wiring-branch pad comprises a plurality of pad units electrically connected to one another. There is no restriction on a form of the unit pad or on a form of connection therebetween. Some pads may be cross or fan-shaped unit pads connected to one another in a circular form. The wiring-branch pads avoid the problem of a lead or a pad of a component not having enough area onto which a plurality of wires can be connected.

The bonding apparatus of the present invention provides a capillary tip of a bonding head which can be freely oriented in a three-dimensional space, so that components can be flexibly bonded from multiple directions.

Generally, electrodes are complicatedly positioned because they are arranged on a planar substrate under the assumption that wires are directly or indirectly connected to the electrodes of the components and the components are rearranged. For instance, there is a case in which one of the components is reversely packaged and a lead thereof points in an upward direction. In such a case where electrodes are arranged in various positions and in various directions, an area where bonding can be performed can be enlarged by allowing a direction of a tip of a capillary to be freely changed in three-dimensions, thereby allowing bonding to be executed from the side direction of an electrode.

Further, wiring can be carried out by computerizing and automating the wiring method.

Other objects and features of this invention will become apparent from the following description with reference to the accompanying drawings.

BRIEF DESCRIPTION OF THE DRAWINGS

FIGS. 11A and 11B illustrate a wiring condition a;

FIG. 12 is a flow chart illustrating a method of determining whether wiring satisfies the wiring condition a;

DESCRIPTION OF THE PREFERRED EMBODIMENTS

Figure 1:
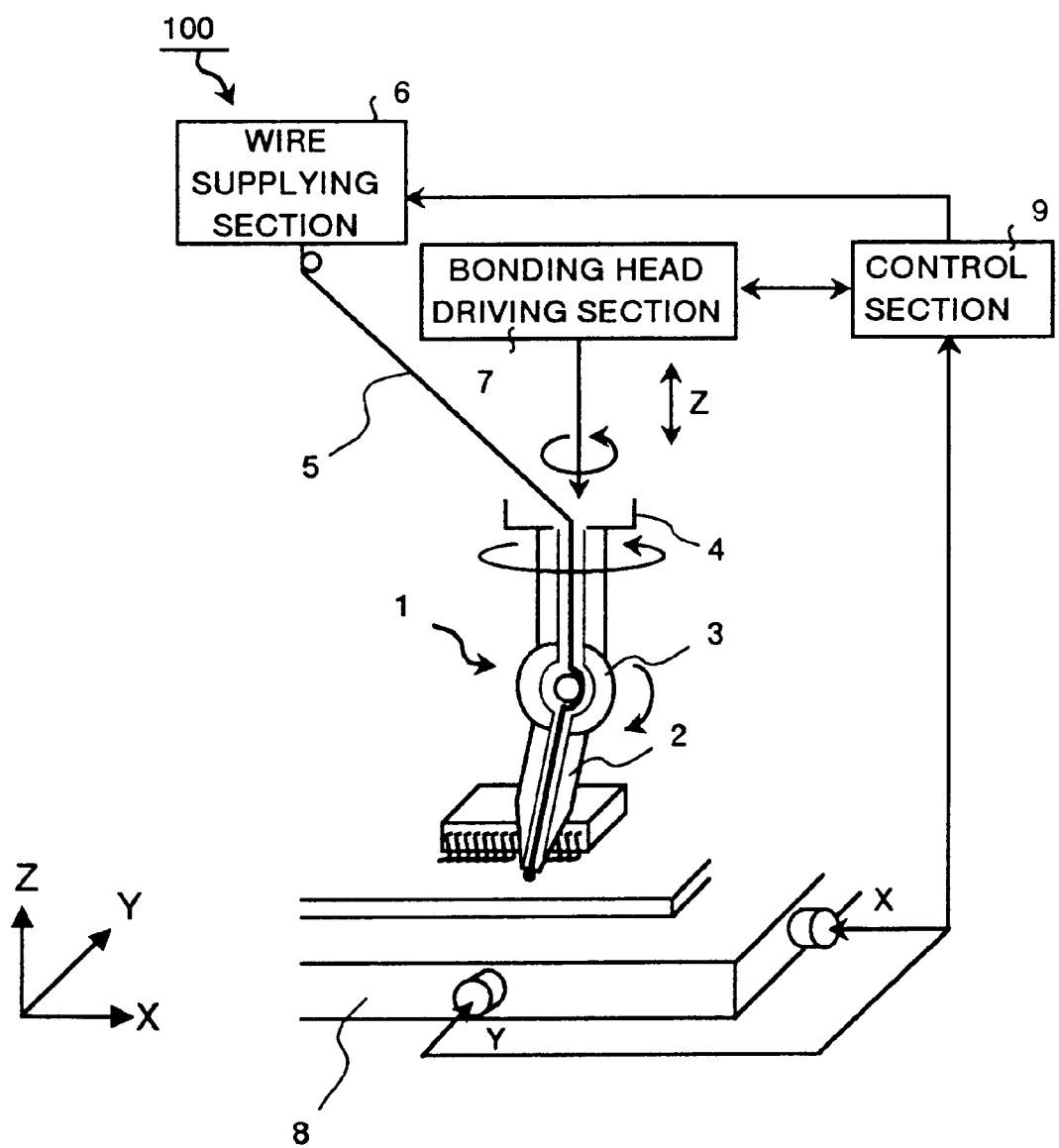
FIG. 1 illustrates a bonding apparatus according to the present invention.

FIG. 1 illustrates the bonding apparatus according to the present invention. In this bonding apparatus 100, a capillary 2 of a bonding head 1 has a first movable section 3 and a second movable section 4, each of which can be axially controlled. By rotating the first movable section 3 and the second movable section 4 of the capillary 2, a lead section or the like of an LSI (Large Scale Integrated Circuit) can be bonded from the side direction thereof.

A wire 5 is supplied to the capillary 2 from a wire supplying section 6. The bonding head 1 is driven in the Z-axial direction by a bonding head driving section 7. A substrate and components to be bonded are placed on an XY table 8. The wire supplying section 6, bonding head driving section 7, and the XY table 8 are controlled by a control section 9 for controlling the entire apparatus. It should be noted that a robot arm may be used as the bonding head 1.

Figure 2:
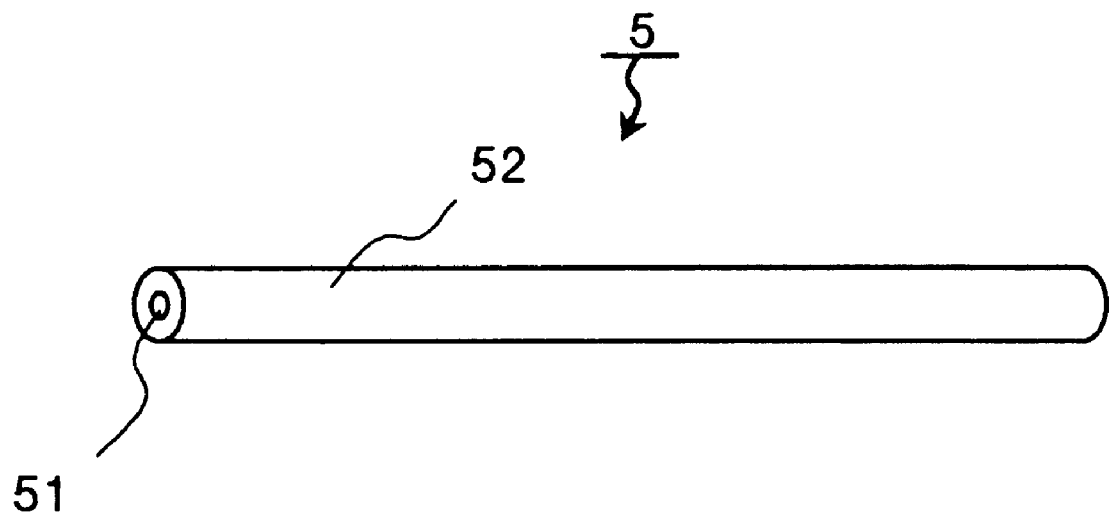
FIG. 2 illustrates a wire used for bonding.

FIG. 2 illustrates a wire 5 used for bonding. This wire 5 comprises a conductive section 51 made of gold, copper or the like and an insulating section 52 comprising an insulator made of vinyl or the like for covering the conductive section 51. When bonding is to be performed, the insulating section 52 is first melted by heat or an ultrasonic wave so that the conductive section 51 becomes bare for an approximate length of 1 mm. The tip of the wire is then melted using a means such as an ultrasonic wave, a laser, or heat to form a metal ball point. The metal ball point is then pressed down to the lead or the like to be connected thereto.

A length of the conductive section to be made bare may be determined based on a lead length, a diameter of a pad, a space between leads, or a space between pads. A wire 5 with adequate size smaller than a lead width or a pad width of a component should be selected for proper bonding. More importantly, however, a wire which is as thick as possible should be selected for wiring a power supply unit or grounding.

Figure 3:
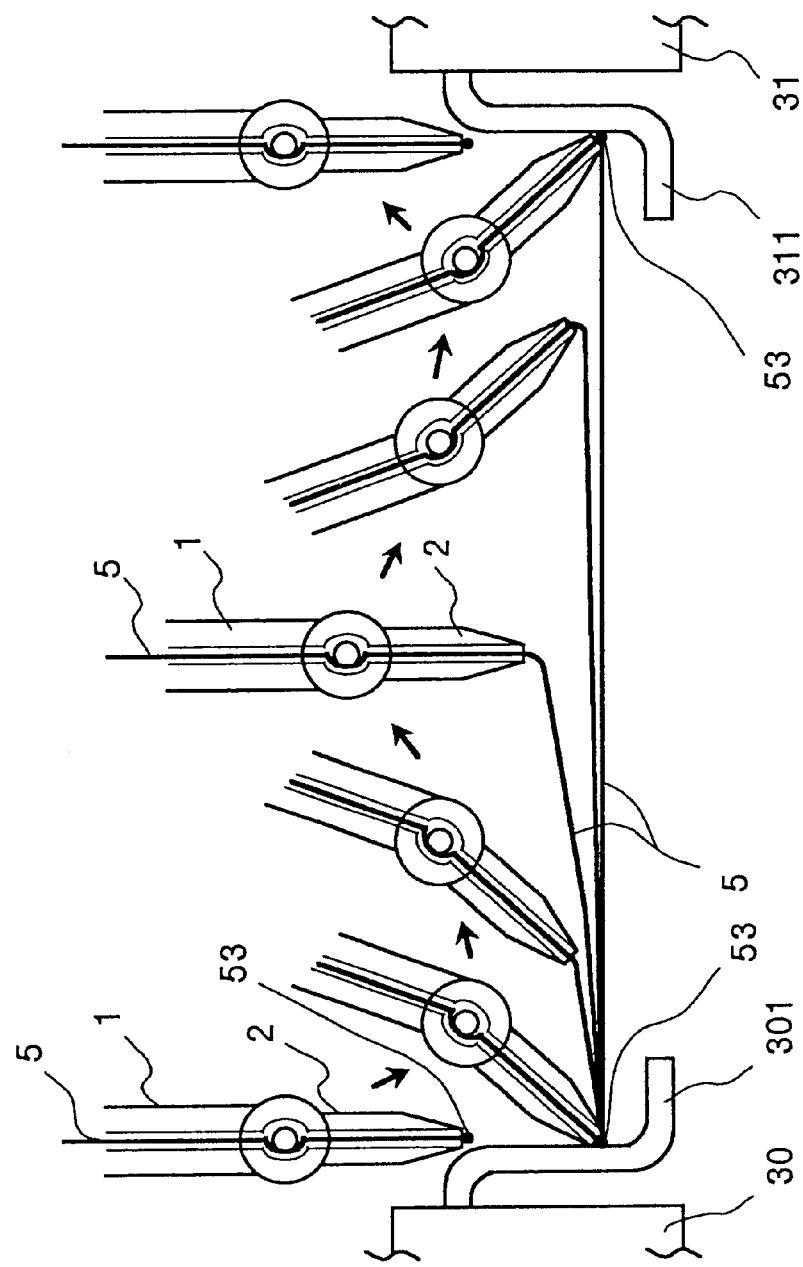
FIG. 3 illustrates the operational movement of the bonding head shown in FIG. 1.

FIG. 3 illustrates the operational movement of the bonding head 1 shown in FIG. 1. When connection is to be made between leads 301 and 311 of LSI 30 and 31, respectively, a metal ball point 53 is first formed at the tip of a capillary of the bonding head 1. The metal ball point 53 is pressed down onto the lead 301 from the side direction thereof to connect the wire 5 thereto by controlling the first and second movable sections 3, 4. The capillary 2 is then moved along a gentle arc to the other lead 311 to be connected. During the movement of the capillary 2, the first and second movable sections 3, 4 are rotated so that the tip of the capillary 2 points in the opposite direction. Finally, the wire 5 is connected to the lead 311 by pressing down the metal ball point 53 formed as described above onto the lead 311 from the side direction thereof.

Figure 4:
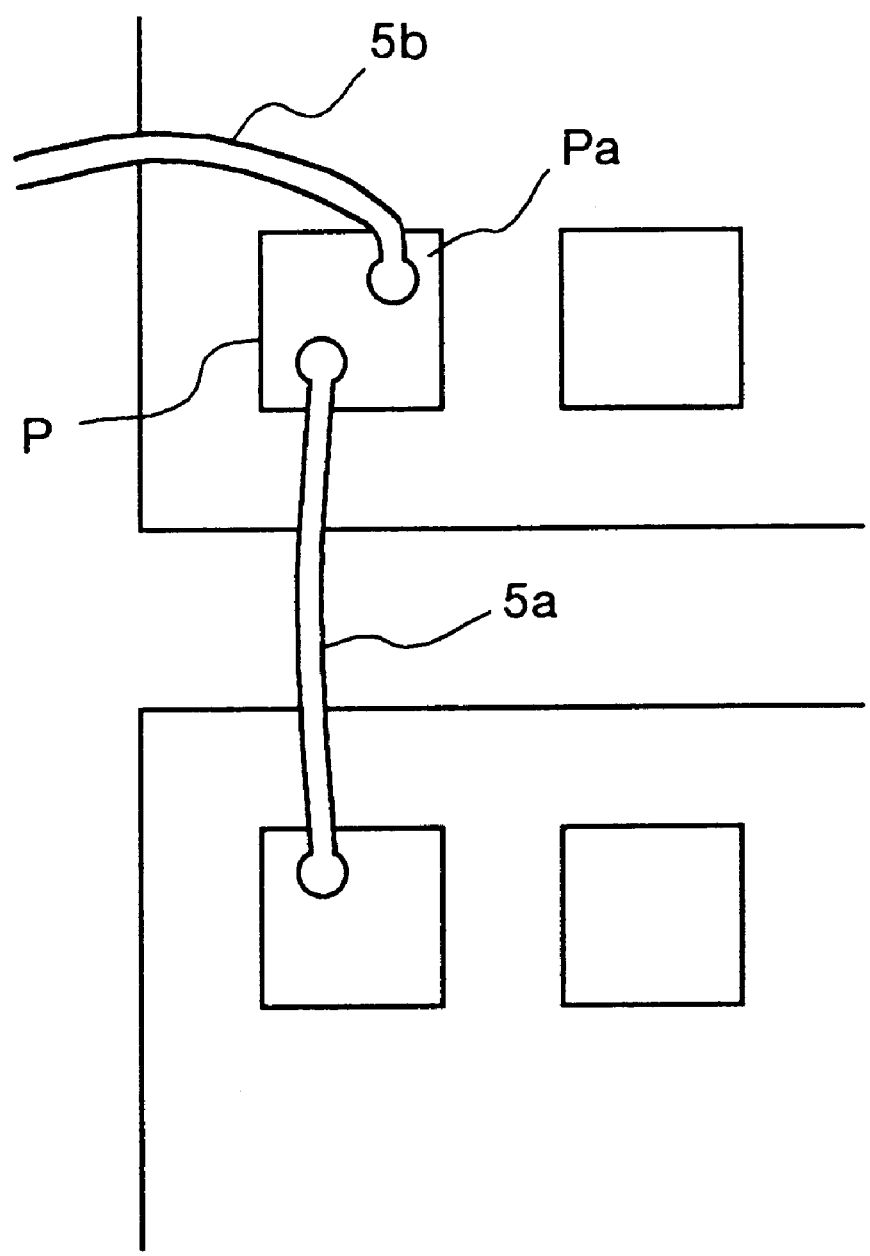
FIG. 4 illustrates an example of a wiring state of a wire to be branched.

When wiring is to be branched, a plurality of wires are connected to one lead or pad. It should be noted that the area of the lead or pad should be wide enough to allow the plurality of wires to be connected. For example, as illustrated in FIG. 4, branching is carried out by connecting a wire 5b to an unoccupied portion Pa on pad P onto which wire 5a has already been connected. As the pad area increases, the number of branched lines may be increased. However, the pad area has a limit.

Figure 5:
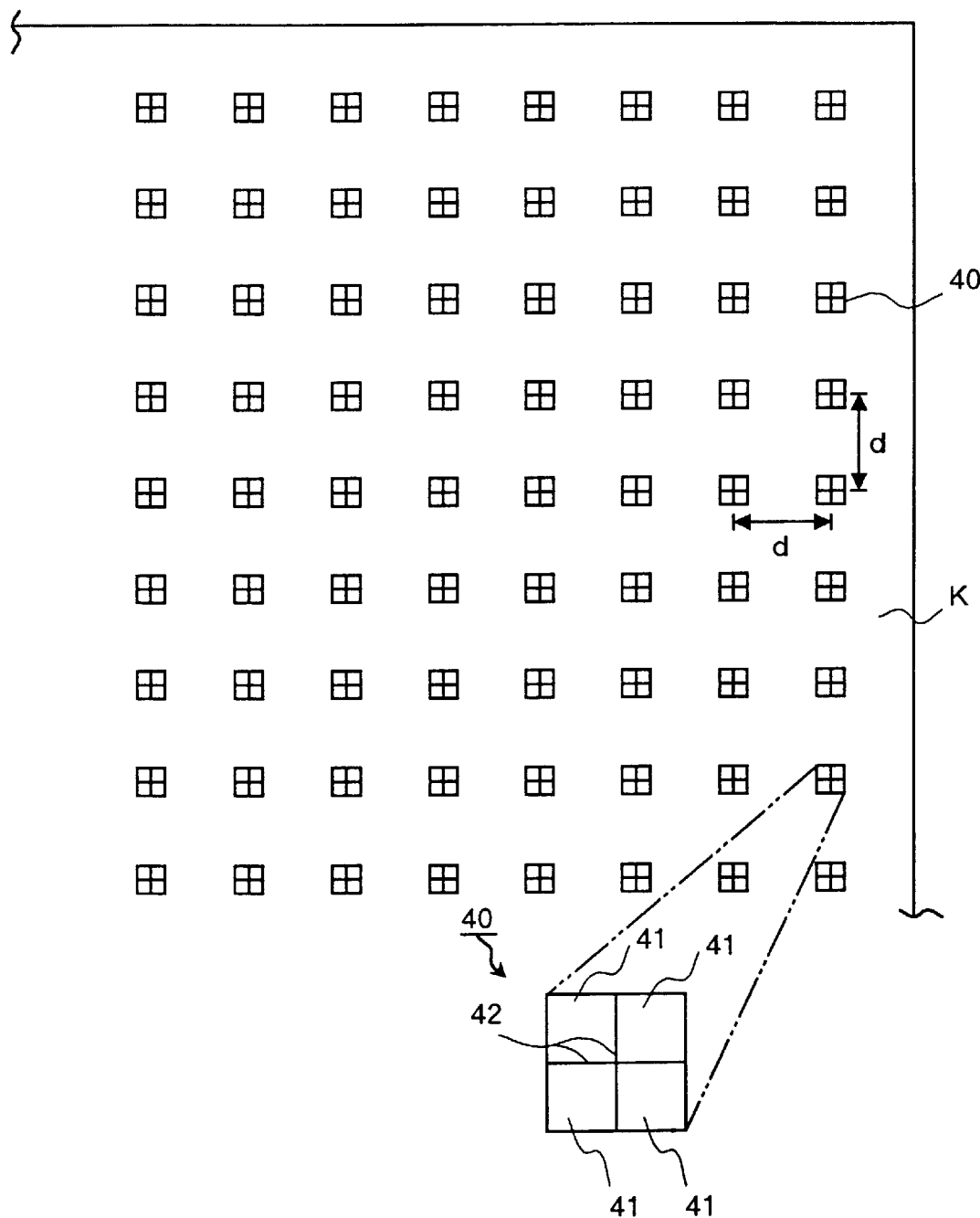
FIG. 5 illustrates one example of a wiring-branch pad.

A wiring-branch pad is used in a case where wire cannot be branched from one lead or a pad due to, for instance, an insufficient length of a lead or an insufficient area of a pad. FIG. 5 illustrates an example of such a wiring-branch pad. A plurality of these wiring-branch pads 40 have been previously printed on a substrate K and arranged with a specified space therebetween (d+5 mm) in a grid pattern. Each of the wiring-branch pads 40 have an area wide enough for two or more lines of the wire 5 to be connected thereto.

In the example illustrated in FIG. 5, each of the wiring-branch pads 40 comprise four unit pads 41. Each unit pad 41 has an area which is ¼ of its branch pad 40, an area large enough to connect thereto one line of the wire 5. Each unit pad 41 is electrically connected to the other three unit pads 41 of its branch pad 40, but is separated from the others by virtual lines 42. The virtual lines 42 prevent, via surface tension, melted metal from flowing onto adjacent unit pads 41 when connecting a wire 5 thereunto. Also, a surface of each unit pad 41 is processed to make it easier to connect the unit pad 41 to a wire such as a gold-plated wire or the like.

Figure 6A:
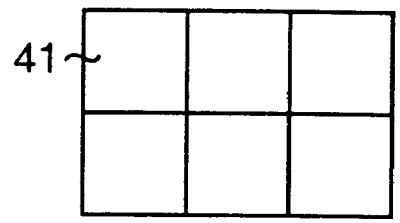
FIGS. 6A to 6E illustrate modified examples of the wiring-branch pad.
Figure 6B:
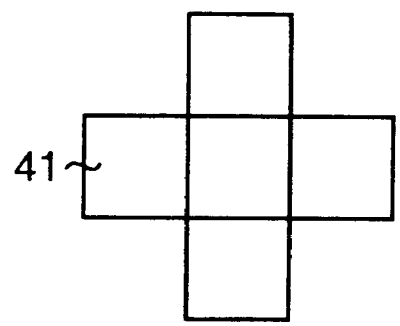
Figure 6C:
Figure 6D:
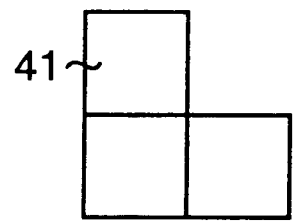
Figure 6E:
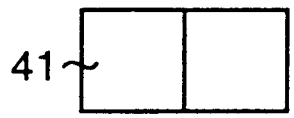

FIGS. 6A to 6E illustrate modified examples of the wiring-branch pad 40. A pattern of the wiring-branch pad 40 can be varied according to an area or a form of the pad. For example, FIG. 6A shows a pattern in which the unit pads 41 are arranged 3 rows by 2 columns, FIG. 6B shows a pattern in which the unit pads 41 are arranged in a cross-shaped pattern, FIG. 6C shows a pattern in which the unit pads 41 are arranged three in a row, FIG. 6D shows a pattern in which the unit pads 41 are arranged in an L-shaped pattern, and FIG. 6E shows a pattern in which the unit pads 41 are arranged two in a row.

Figure 7:
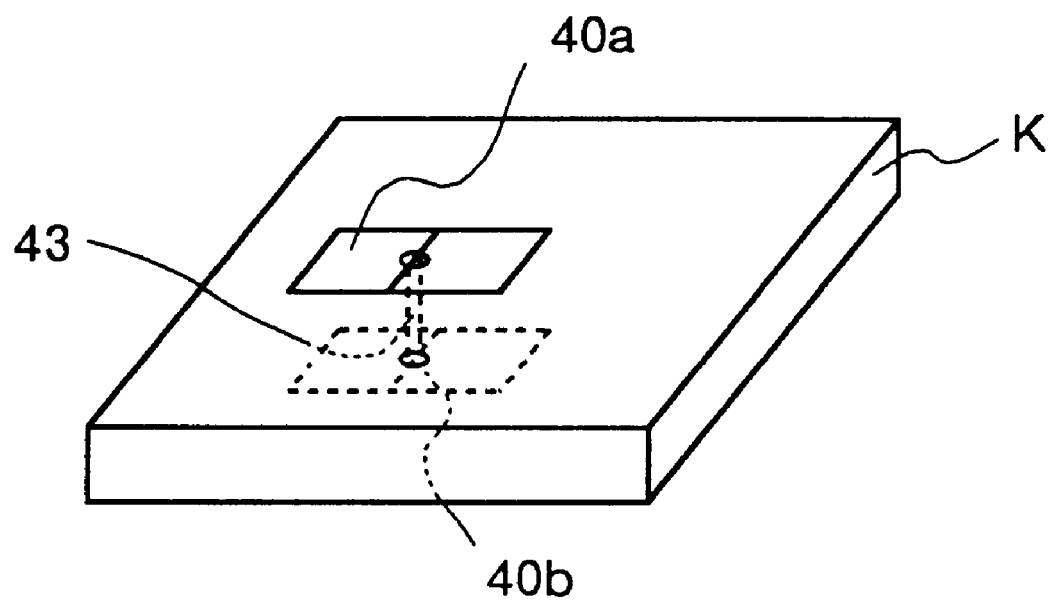
FIG. 7 illustrates another modified example of the wiring-branch pad.

Further, the unit pad 41 may have various forms such as a circle, an oval, a sector or a rectangle. Unit pads having different forms may be combined with one another. As illustrated in FIG. 7, a wiring-branch pad 40a on the front surface of the substrate K and a wiring-branch pad 40b on the rear surface of the substrate K are connected to each other by way of a through hole 43 in the substrate K. As a result, it is possible to branch wiring located on opposite surfaces of the same substrate.

Figure 8:
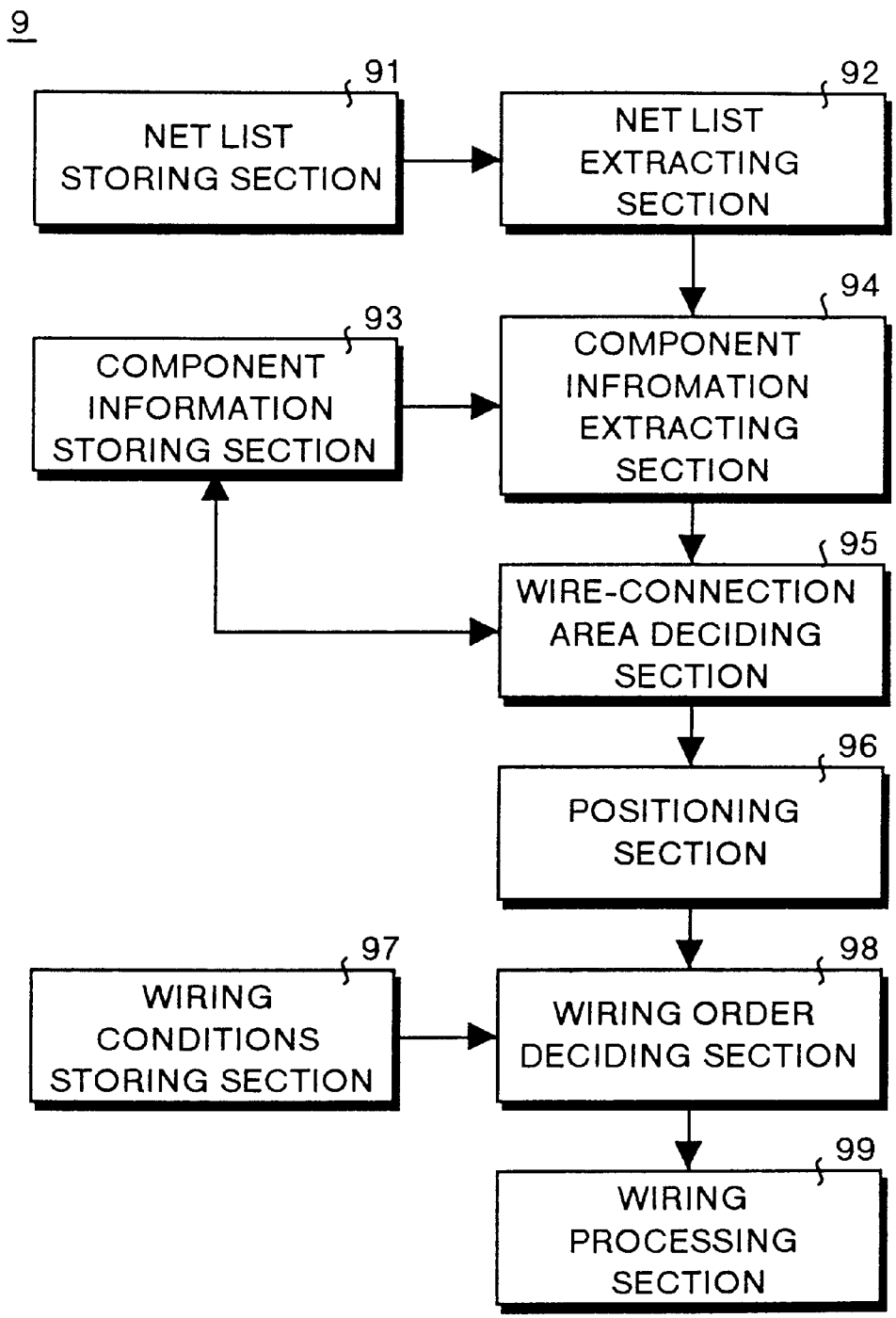
FIG. 8 is a functional block diagram of the control section shown in FIG. 1.

A wiring method using the bonding apparatus described above will now be described. FIG. 8 is a functional block diagram of the control section 9 shown in FIG. 1. This control section 9 comprises a net list storing section 91 for storing wiring information or the like, a net list extracting section 92 for extracting the wiring information stored in the net list storing section 91 which includes a logic circuit diagram, a component information storing section 93 for storing component information, a component information extracting section 94 for extracting component information such as a three-dimensional form of a component (including a three-dimensional form of a lead or a pad) from the component information storing section 93, a wire-connection area determining section 95 for determining an area enabling connection of a wire thereto, a positioning section 96 for determining a position to mount components on the substrate according to component information, a wiring conditions storing section 97 for storing various conditions for wiring, a wiring order determining section 98 for determining a wiring order based on the component information, component arrangement information and the wiring conditions, and a wiring processing section 99 for processing wiring.

Figure 9:
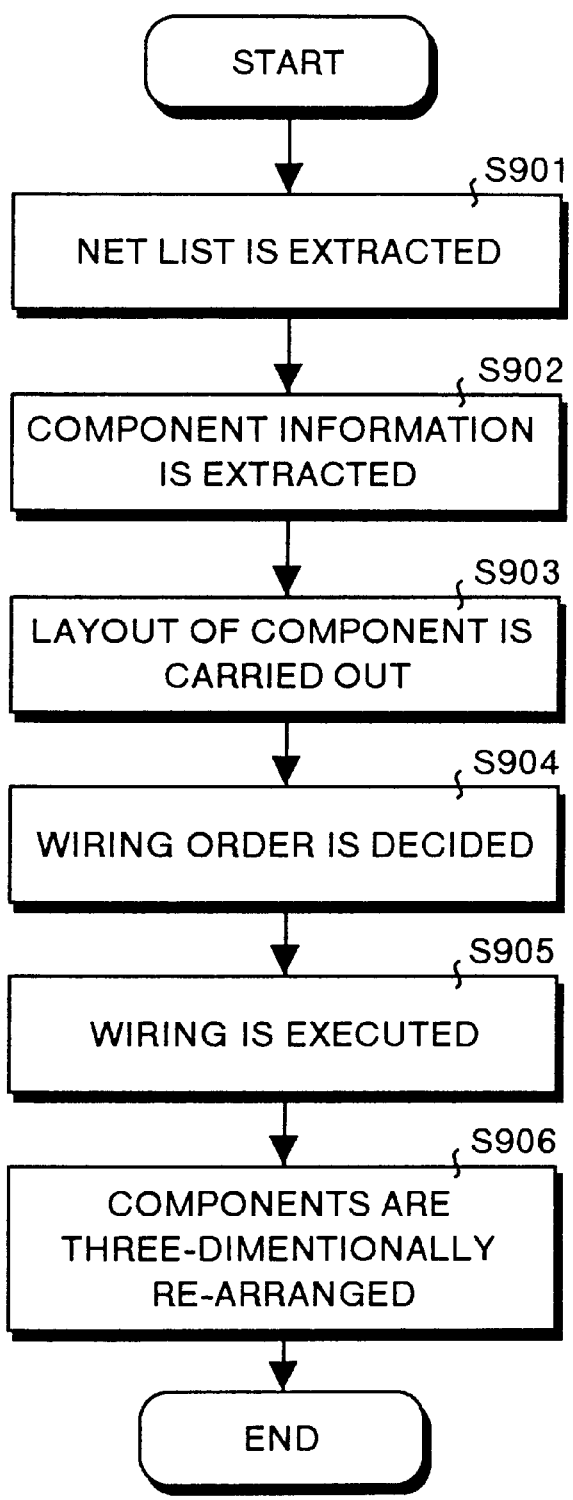
FIG. 9 is a flow chart illustrating the wiring steps of the bonding apparatus.

FIG. 9 is a flow chart illustrating the wiring steps of the bonding apparatus 100. In step S901, wiring information or the like is extracted as a net list from the logic circuit diagram in the net list storing section 91. In step S902, information for certain components is extracted from a data book or the like in the component information storing section 93. At the same time, any portion to which a lead on the component or a wire on the pad can be connected is determined. Any area to which a wire can be connected is separated by virtual lines from the other portions on the lead or the pad and is registered as component information. In step S903, a layout of the components on the substrate is carried out for packaging based on the three-dimensional form of each component.

In step S904, a wiring order is determined based on the wiring information and component information. The wiring order is determined based on wiring conditions such as:

wiring condition a: lead or pad for another component is not hidden by the wiring;

wiring condition b: the wiring height is the lowest possible value; and wiring condition c: the wiring length is the shortest possible path.

The following steps S905 (wiring execution) and S906 (three-dimensionally rearranging the components) will be discussed further below.

Figure 10:
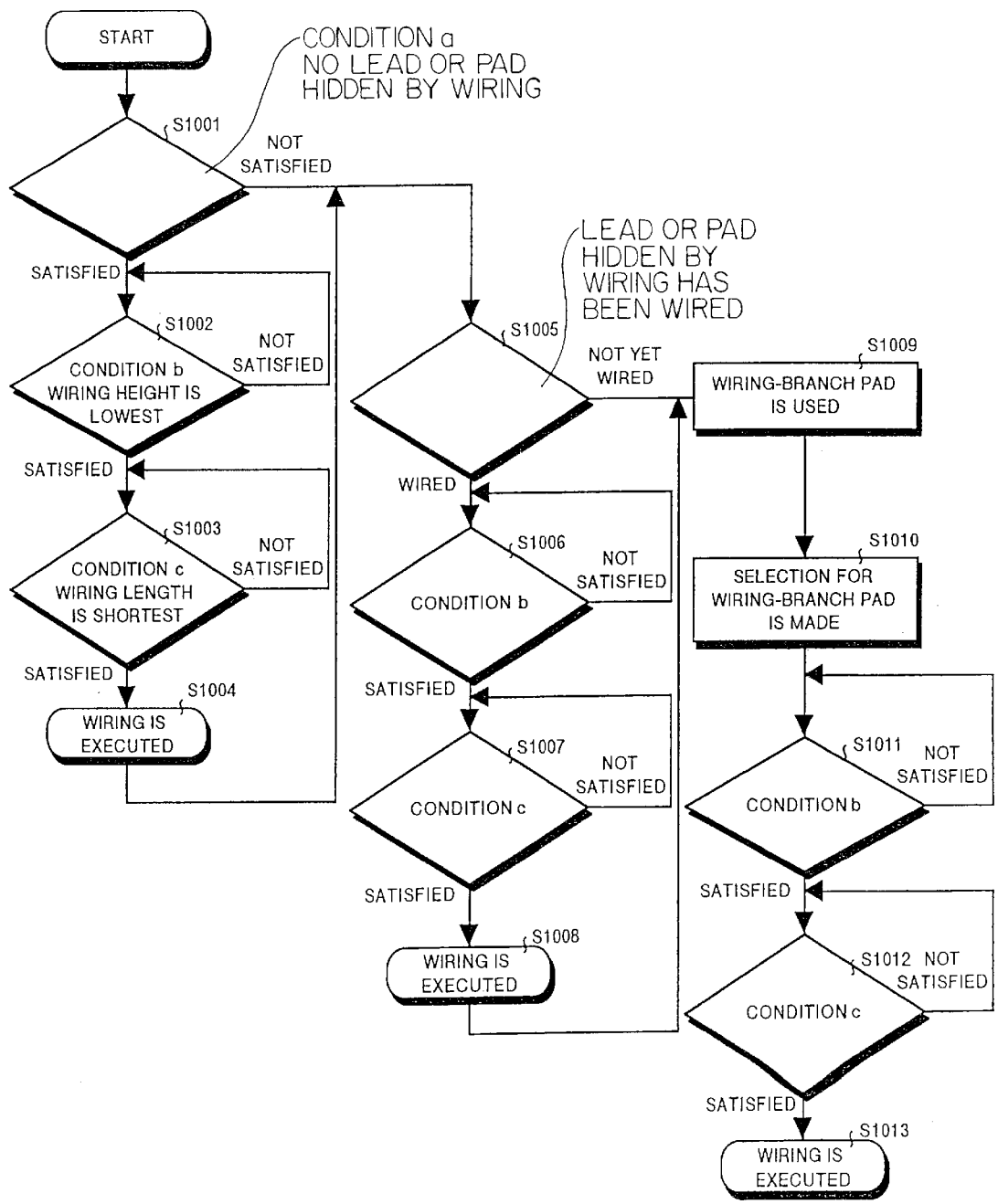
FIG. 10 is a flow chart illustrating steps up until a step in which a wiring order is determined according to wiring conditions.

FIG. 10 is a flow chart illustrating the steps performed up to the step in which the wiring order is determined according to wiring conditions (i.e., step S904). In step S1001, determination is made as to whether the wiring satisfies wiring condition a (i.e., lead or pad for another component is not hidden by the wiring). In step S1002, any wiring path satisfying wiring condition b (i.e., the wiring height is the lowest possible) is searched for. Further, in step S1003, the wiring satisfying wiring condition c (i.e., the wiring length is the shortest possible) is searched for. Wiring is then executed such that wiring conditions a-c are satisfied (step S1004).

Figure 11A:
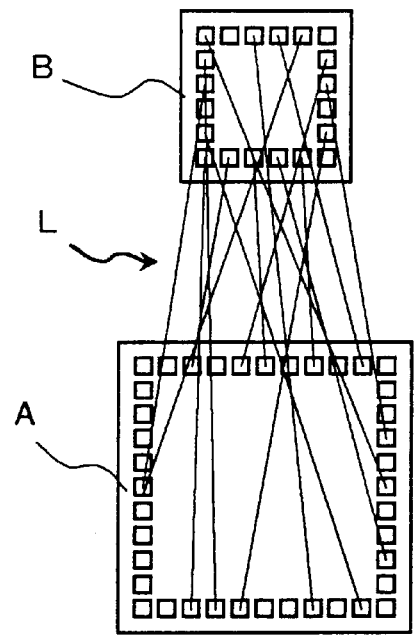
Figure 11B:
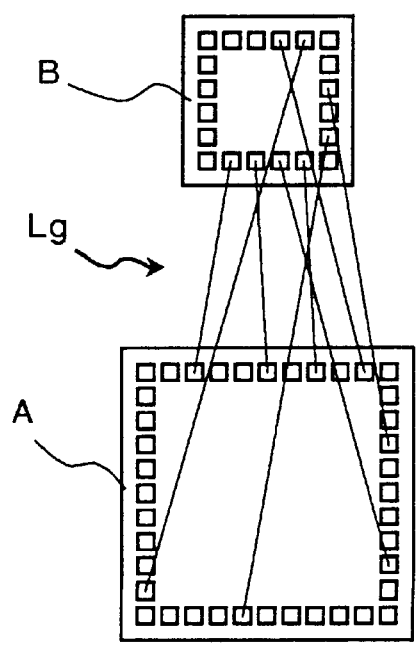

FIGS. 11A and 11B illustrate wiring condition a. When a component A and a component B are to be connected to one another, of all the wiring Ly in FIG. 11A and the wiring Lg in FIG. 11B illustrate a case where a lead or pad for another component is not hidden by the wiring. It should be noted that any lead or pad previously specified not-to-be-connected using logical designing is not taken into consideration in a CAD system.

Figure 12:
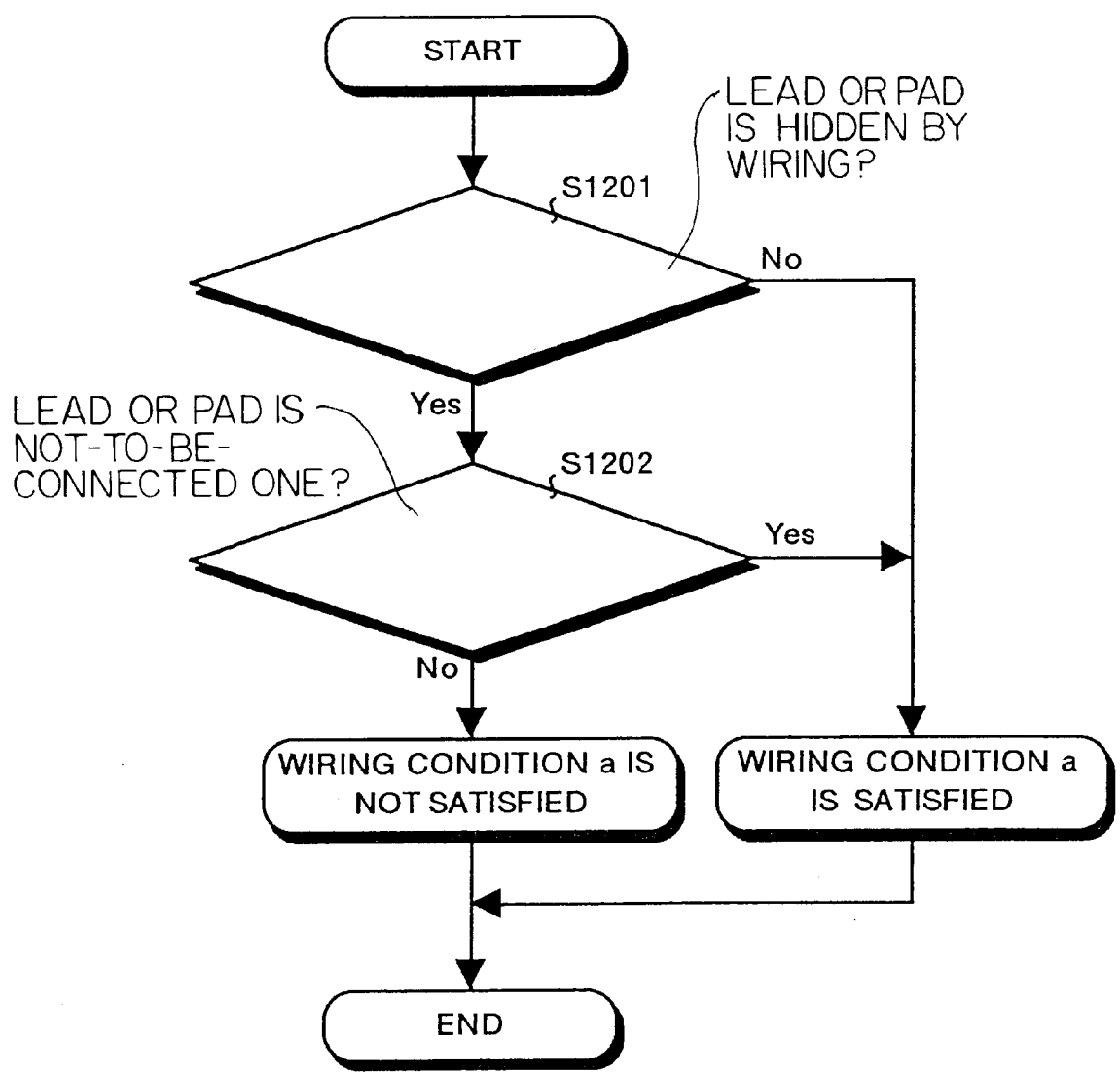

FIG. 12 is a flow chart illustrating a method of determining whether wiring satisfies wiring condition a (i.e., step S1001 in FIG. 10). In step S1201, determination is made as to whether any lead or pad is hidden by the wiring. When a lead or pad is not hidden by the wiring, the wiring satisfies the wiring condition a. In step S1202, when a lead or pad is hidden by the wiring, determination is made as to whether the lead or pad is not-to-be-connected. If the lead or pad hidden by the wiring is not-to-be-connected, the wiring satisfies the wiring condition a; otherwise, the wiring does not satisfy the wiring condition a.

Figure 13A:
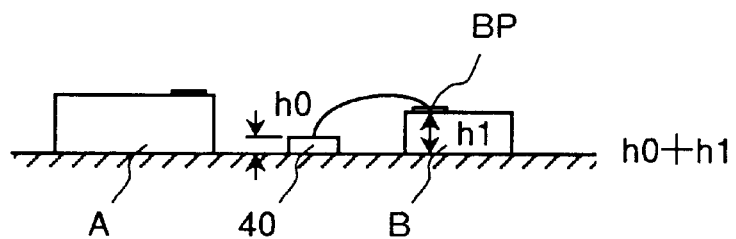
FIGS. 13A to 13C illustrate a wiring condition b.
Figure 13B:
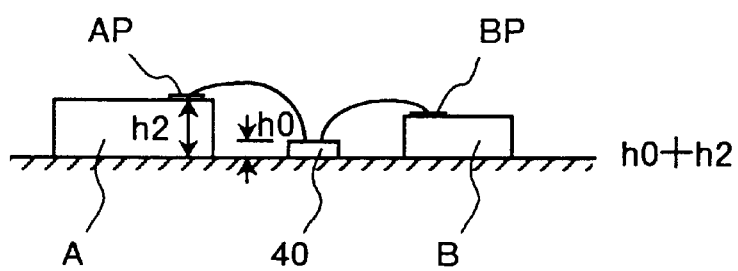
Figure 13C:
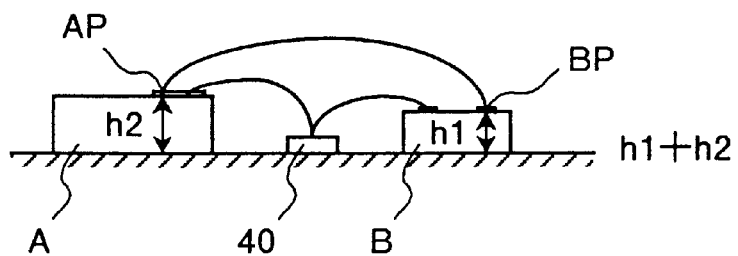

FIGS. 13A to 13C illustrate examples of wiring condition b. Wiring is carried out in ascending order of height obtained by summing any two of the heights h0, h1 and h2 of leads or pads to be wired. A sum of the heights h0 and h1 is smallest, so that the wiring-branch pad 40 and the pad BP of the component B are first to be connected to one another (FIG. 13A). A sum of the height h0 and h2 is the next smallest, so the wiring-branch pad 40 and the pad AP of the component A are next to be connected to one another (FIG. 13B). The pad AP of the component A and the pad BP of the component B, which together have the highest height, are last to be connected to one another (FIG. 13C).

Figure 14:
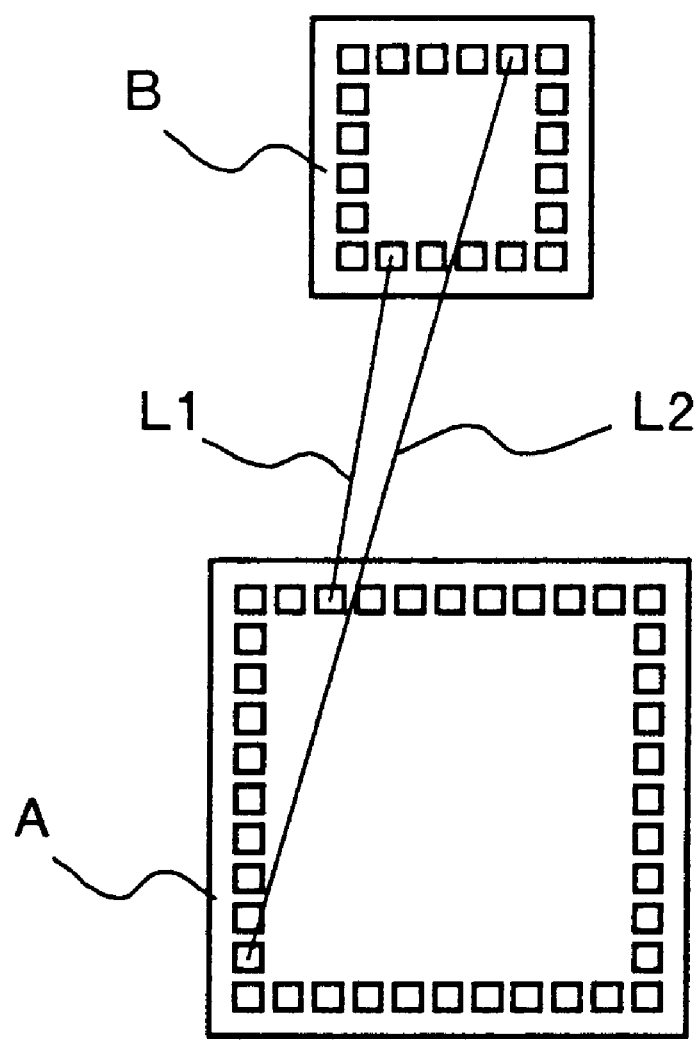
FIG. 14 illustrates a wiring condition c.

FIG. 14 illustrates an example of wiring condition c. Wiring is carried out in ascending order of wiring length. Comparing a wiring L1 to a wiring L2, it is found that the wiring L1 is shorter than wiring L2, so that wiring L1 is wired before wiring L2.

When wiring does not satisfy wiring condition a (i.e., when a lead or pad for another component is hidden by the wiring; step S1001 in FIG. 10), in step S1005, determination is made as to whether any lead or pad hidden by the wiring has already been wired. If it is determined that the lead or pad has already been wired, wiring is carried out according to the wiring conditions b and c (steps S1006 to S1008). Alternatively, if it is determined that the lead or pad hidden by the wiring has not been wired and direct wiring is not possible, the wiring-branch pad 40 is used in step S1009. In step S1010, selection is made for the wiring-branch pad 40. For example, when wiring is to be executed between the pad AP of component A and the pad BP of component B, as illustrated in FIG. 15, a wiring-branch pad 40 is preferentially used so that the wiring satisfies wiring condition a and also so that angles α1 and α2, as well as angles β1 and β2, are substantially uniform with respect to the wiring-branch pad 40.

When a lead or pad for another component is hidden by the wire, a wiring-branch pad 40 at a prespecified position, as shown in FIG. 5, is selected. If connection to this wiring-branch pad 40 is impossible due to a crossing of another wire, either a wiring-branch pad at another prespecified position is selected or a new wiring-branch pad is provided.

A wiring-branch pad 40 previously provided on the substrate is used if it makes wiring easier. Any of the forms shown in FIGS. 5 to 7 can be used for a wiring-branch pad 40. On the other hand, if a large number of complicated wirings are to be made, it is possible that no wiring-branch pad 40 is available in a required place. In such a case, an additional wiring-branch pad 40 suitable for arrangement of components or wiring is mounted on or formed on the substrate. The wiring-branch pad 40 may be mounted any place on the substrate using an adhesive or the like. The mounted wiring-branch pad 40 may be removed using a solvent, thereby making the wiring-branch pad 40 an advantageous tool for three-dimensionally rearranging components. In such a case, the wiring-branch pad is treated as a component. Alternatively, when three-dimensional rearrangement of components is not required (i.e., when it is not required to separate the wiring-branch pad 40 from the substrate), it is more efficient to print a wiring-branch pad on the printed board.

Figure 15:
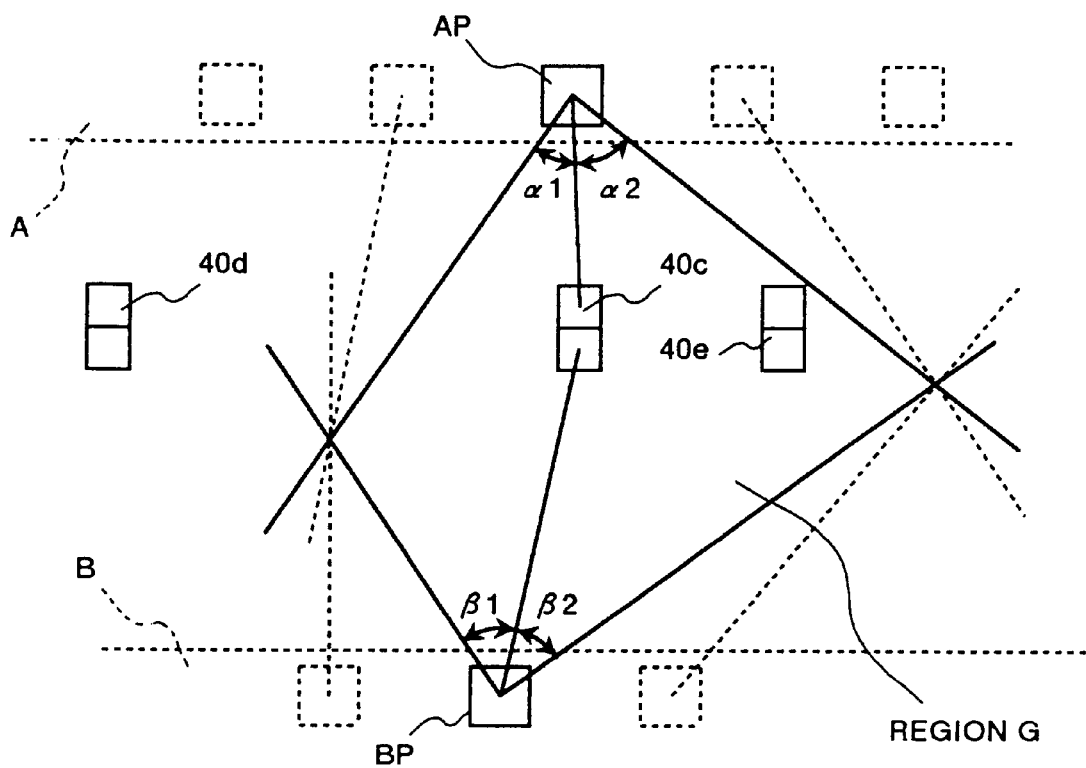
FIG. 15 is a view for explaining the selection of a wiring-branch pad.

For instance, as shown in FIG. 15, if it is determined that the wiring-branch pads 40*c* and 40*d* satisfy the condition discussed above (i.e., are located within region G which is defined as an area between angles α1 and α2 and between angles β1 and β2) whereas the wiring-branch pad 40*e* does not, and if the wiring-branch pads 40*c* and 40*d* are not each already connected to wires, the wire 5 is connected to the wiring-branch pads 40*c* and 40*d*. Alternatively, if the wiring-branch pads 40*c* and 40*d* have each already been wired, any other wiring-branch pad is selected, the components are rearranged, each wiring connected to the wiring-branch pads 40*c* or 40*d* is rewired, or a wiring-branch pad 40 is newly prepared within the region G.

After the wiring-branch pad 40 is selected, wiring is carried out according to wiring conditions b and c (steps S1011 to S1013).

Figure 16:
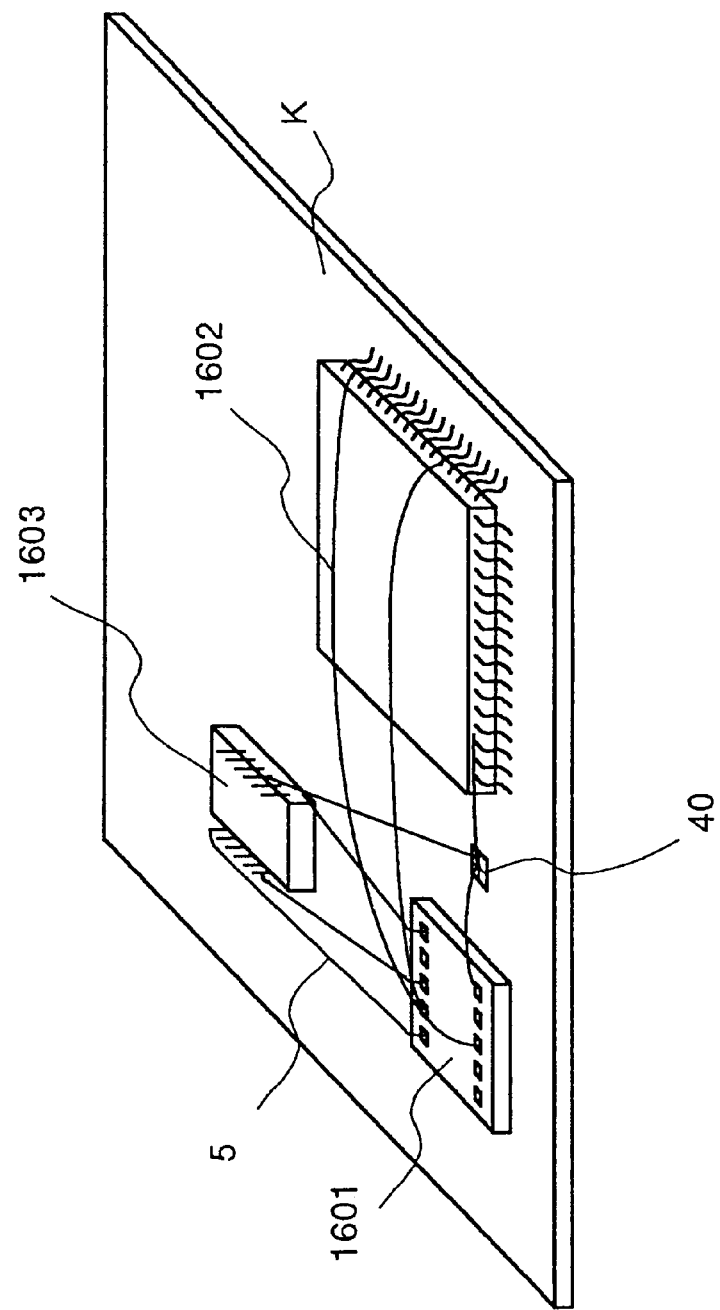
FIG. 16 illustrates a state in which components are packaged on a substrate.

In step S905 in FIG. 9, the components are actually arranged on the substrate and wiring therebetween is carried out with the wire 5. At first, the components are fixed to the substrate K with an adhesive or the like. For example, as illustrated in FIG. 16, a bare chip 1601 and a face-package component 1602 are mounted on the substrate K. Additionally, a discrete component 1603 is mounted on the substrate in a reverse direction such that the leads of the component face upward.

It is required to precisely detect positions of leads or a pad of the component when a wire is to be connected thereto. Measurement of those positions is carried out using a device such as a three-dimensional measuring device. Points to be measured are a body form, lead form and pad form of the component, and coordinate values of the component on the substrate or the like. When the components can not precisely be mounted or forms of the components are different from one another, a three-dimensional form for each substrate must be measured.

Wiring is actually carried out to a portion on the lead or the pad of the component previously registered at a place where a wire can be connected according to the determined wiring order (step S904). Sufficient tension is given to the wire 5 so that the leads or the pads are not hidden by a bending of the wire 5 during subsequent wiring. If a wire must be loosely connected because the wire strength is rather low, the substrate is placed upside down so that the wire hangs down by the force of gravity, and then subsequent bonding is carried out from the down side of the substrate.

Figure 17A:
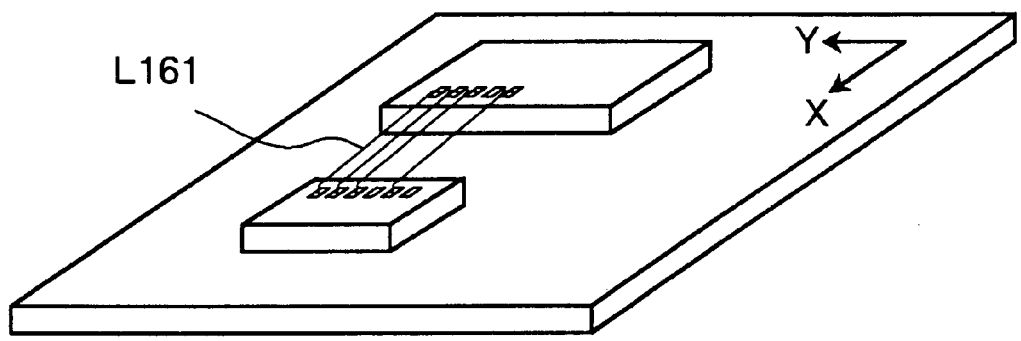
FIGS. 17A and 17B are views for explaining conditions required for determining a wiring length.
Figure 17B:
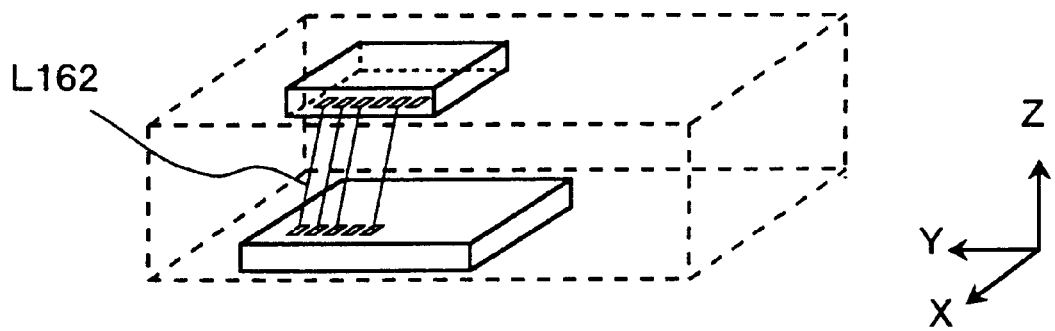

In step S906, the components are three-dimensionally rearranged after the wiring is finished. This operation is performed to further reduce the mounted area. Practically, the components are three-dimensionally arranged on a computer such as a CAD before wiring to compute each length of the entire wiring. The components are developed on the plane based on the wiring length and positions of leads and pads, and then the wiring is carried out. During the wiring work, as illustrated in FIGS. 17A and 17B, a wiring length (L161 in FIG. 17A) on the plane including a wiring-branch pad (not shown in the figure) should not be shorter than the wiring length (L162 in FIG. 17B) computed for the subsequent three-dimensional arrangement of the components.

Figure 18:
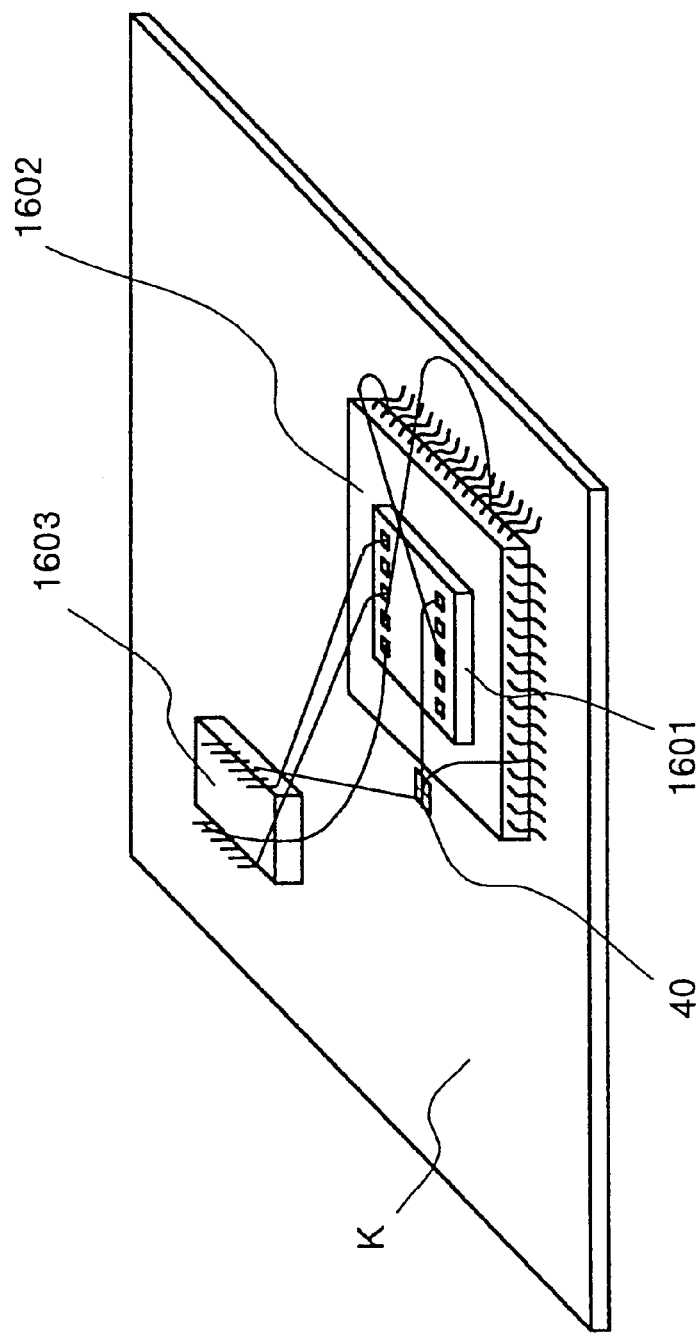
FIG. 18 illustrates a state in which the components are rearranged on a substrate.
Figure 19:
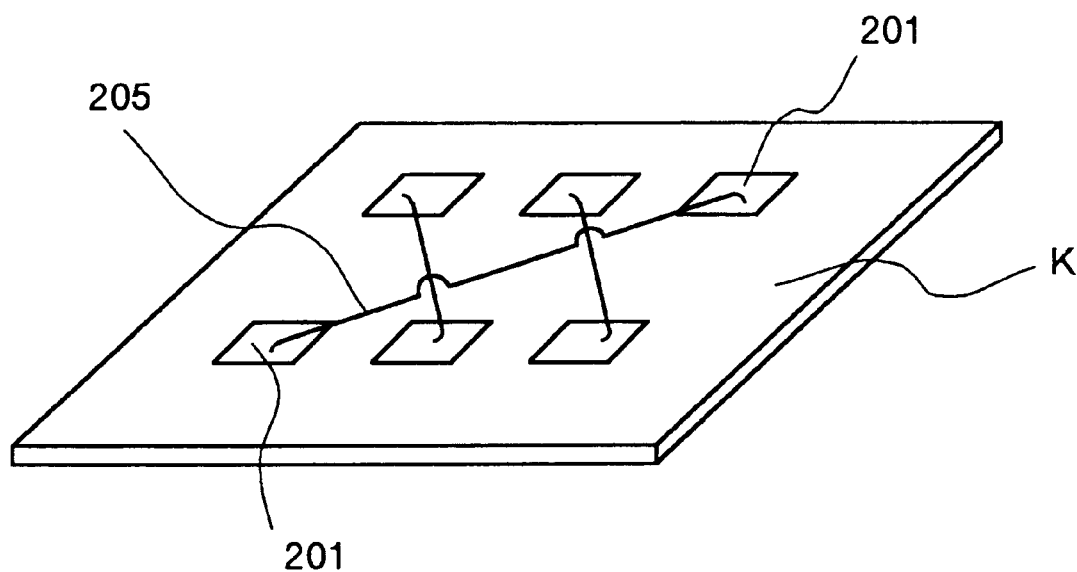
FIG. 19 illustrates a conventional printed board in which wiring is located between pads on a substrate with lead wires covered with insulating material by the ordinary bonding apparatus.

In order to arrange the components in a three-dimensional manner, the components mounted and fixed on the plane with adhesive are removed from the plane using a solvent or the like. As illustrated in FIG. 18, the bare chip 1601 is peeled off and is rearranged on top of the face-package component 1602 to be fixed to the face-package component 1602 with the adhesive or the like. For this reason, the packaged area can be reduced and three-dimensional arrangement can be carried out with high precision. It should be noted that the surface of the electrode after the wiring is applied thereto is covered by using a spray which forms an insulating film or the like so that the leads, pad, and wire-connecting section will not be shorted. Similarly, the wiring-branch pad 40 is peeled off from the substrate with a solvent or the like. It should be noted that any material that can be melted by the solvent can be used for a substrate, components are removed by melting the substrate itself, and then the components are rearranged.

With the present invention, wiring between components such as leads or pads of an electronic components is directly carried out with a wire 5 or is indirectly carried out using a wiring-branch pad 40. Wiring is also carried out in an efficient order. Further, wiring is carried out between components which are mounted on the plane, and then the components are three-dimensionally rearranged. For this reason, it is possible to execute three-dimensional wiring more easily and more flexibly, which is particularly useful for packaging components to be used in compact-size portable equipment having a smaller plane space therein.

Even if face-package components or discrete components, in addition to a bare chip, are present on the same plane, wiring can be carried out using leads and pads of each component. The conventional printed circuit boards are not required for direct wiring between leads or pads of the components. It is not required that conventional printed circuit boards be used for directly wiring between leads or pads of the components. Therefore, any substrate such as one for testing can be developed within a short period of time. Further, the present invention also permits manual connection of jumper cables which was previously difficult due to the density of the cables.

As described above, with a wiring method according to the present invention, components are temporarily placed on a substrate, electrodes of the components are directly or indirectly connected to one another with a wire in the above placement state, and the temporarily-placed components are removed from the substrate and are three-dimensionally rearranged thereon, so that the components can be more easily and compactly three-dimensionally packaged. This is extremely useful for wiring in compact-size portable equipment or the like having a smaller plane space for wiring.

Also, wiring is carried out on the plane of the substrate, and then is three-dimensionally rearranged, thereby making the wiring easier. Any substrate such as one for testing can be prepared within a short period of time. Further, a reflection noise generated due to board of the substrate or the like is reduced, so that the wiring method can be used to manufacture a high-frequency circuit.

Further, when wires used for connecting electrodes of components to one another are branched for wiring therewith, a wiring-branch pad is arranged in a space between the electrodes thereof to branch the wires by the wiring-branch pad, and the wires can securely and easily be branched for wiring with the electrodes even if an area of an electrode is small.

Further, when other electrodes to be wired are located between electrodes, wiring is first carried out between electrodes which do not have other electrodes to be wired located between them, so that previously executed wiring does not become an obstacle for subsequent wiring. As a result, wiring can be efficiently executed.

Further, wiring is carried out in ascending order of a wiring height after the electrodes are wired with a wire, so that wiring at a higher height does not become an obstacle for wiring at lower heights. As a result, wiring can be securely and efficiently executed.

Further, when wiring between electrodes of components is to be carried out with a wire, wiring is carried out in ascending order of wiring length. Wiring with a larger length seldom becomes an obstacle for wiring with a smaller length.

Further, a wiring-branch pad comprises a plurality of pad units, wherein the plurality of pad units are used for wiring between components and are electrically connected to one another. Accordingly, wires can be securely and easily branched in order to be wired with the pad units even if an area of an electrode is small.

With a bonding apparatus according to another feature of the present invention, a tip of a capillary of a bonding head can be freely oriented in three-dimensional space, so that components can be bonded from multiple directions.

With a computer-readable recording medium according to another feature of the present invention, a program for making a computer execute the wiring method as described above is stored therein, so that, by making a computer read out the program, the wiring can be carried out.

Although the invention has been described with respect to a specific embodiment for a complete and clear disclosure, the appended claims are not to be thus limited, but are to be construed as embodying all modifications and alternative constructions that may occur to one skilled in the art which fairly fall within the basic teaching herein set forth.

What is claimed is:

1. A system for wiring components in a three-dimensional manner, comprising:

means for temporarily placing said components on a substrate, wherein said components have electrodes, wherein said electrodes comprise at least one pair of directly-wired electrodes and at least one pair of indirectly-wired electrodes;

means for directly or indirectly electrically connecting said electrodes together via wires, comprising:

a pad placement unit for placing a wiring-branch pad on said substrate in a space between said at least one pair of indirectly-wired electrodes of the components that are to be indirectly electrically connected together; and a bonding unit for electrically bonding said at least one pair of indirectly-wired electrodes to said wiring-branch pad and for electrically bonding said at least one pair of directly-wired electrodes to each other;

means for removing the temporarily-placed components from said substrate; and means for rearranging said components in a three-dimensional manner.

2. The system for wiring components in a three-dimensional manner as claimed in claim 1, wherein said bonding unit comprises:

a bonding head having a capillary and having an axis defined through said bonding head; and a movable section for rotatably orienting said axis in a three-dimensional space;

wherein said movable section permits said bonding head to electrically bond said wires to said components from a plurality of directions in said three-dimensional space.

3. The system for wiring components in a three-dimensional manner as claimed in claim 1, further comprising:

a plurality of wiring-branch pads, each of said wiring-branch pads comprising:

pad units, each capable of being electrically bonded to a wire; and virtual lines separating said pad units from one another;

wherein said virtual lines prevent, via surface tension, melted metal from flowing from a particular one of said pad units onto adjacent ones of said pad units during electrical bonding of a particular wire to said particular one of said pad units.

4. The system for wiring components in a three-dimensional manner as claimed in claim 1, further comprising:

a wiring configuration control unit for determining a wiring order;

wherein said wiring order is determined based on wiring conditions, said wiring conditions comprising:

whether a wire having a particular path will obscure another electrode which requires wiring at a later time;

whether said wire having said particular path has a lowest height of all remaining wires yet to be wired; and whether said wire having said particular path has a shortest length of said all remaining wires yet to be wired.

5. The system for wiring components in a three-dimensional manner as claimed in claim 4, wherein said wiring configuration control unit further determines whether to utilize said wiring-branch pad to wire between a particular set of electrodes of said components.

6. The system for wiring components in a three-dimensional manner as claimed in claim 1, wherein said substrate further comprises pre-formed wiring-branch pads at predetermined intervals on a surface of said substrate.

* * * * *